United States Patent
Wang et al.

(10) Patent No.: US 8,603,347 B2
(45) Date of Patent: Dec. 10, 2013

(54) METHOD FOR FORMING RECESS DEFECT ON CARBON NANOTUBE

(75) Inventors: Xue-Shen Wang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 211 days.

(21) Appl. No.: 13/335,925

(22) Filed: Dec. 22, 2011

(65) Prior Publication Data

US 2012/0168402 A1 Jul. 5, 2012

(30) Foreign Application Priority Data

Dec. 31, 2010 (CN) .......................... 2010 1 0617897

(51) Int. Cl.
*B44C 1/22* (2006.01)
(52) U.S. Cl.
USPC .................................. 216/8; 216/40; 977/888
(58) Field of Classification Search
None
See application file for complete search history.

(56) References Cited

U.S. PATENT DOCUMENTS

| | | | |
|---|---|---|---|
| 6,841,139 B2 | 1/2005 | Margrave et al. | |
| 7,591,989 B2 | 9/2009 | Smiljanic et al. | |
| 2008/0238285 A1 | 10/2008 | Hong et al. | |
| 2008/0302759 A1 * | 12/2008 | Zhang | 216/13 |
| 2008/0315183 A1 * | 12/2008 | Kinoshita et al. | 257/24 |
| 2009/0197038 A1 | 8/2009 | Wang et al. | |
| 2010/0127242 A1 * | 5/2010 | Zhou et al. | 257/24 |
| 2010/0285300 A1 | 11/2010 | Wang et al. | |

FOREIGN PATENT DOCUMENTS

CN 101249435 8/2008

OTHER PUBLICATIONS

Wang et al., Fabrication of Ultralong and Electrically Uniform Single-Walled Carbon Nanotubes on Clean Substrates, Nano Letters, Aug. 3, 2009, 3137-3141,9(9).

* cited by examiner

*Primary Examiner* — Shamim Ahmed
*Assistant Examiner* — Bradford Gates
(74) *Attorney, Agent, or Firm* — Altis Law Group, Inc.

(57) ABSTRACT

A method for forming a recess defect on a carbon nanotube is introduced. The method includes the following steps. A substrate with a surface is provided. A first carbon nanotube is deposed on the surface of the substrate. A second carbon nanotube is crossed with the first carbon nanotube. The second carbon nanotube crosses the first carbon nanotube and is in contact with the first carbon nanotube. A mask is deposited on substrate, the first carbon nanotube, and the second carbon nanotube. The substrate is etched to remove the second carbon nanotube and form a recess defect on the first carbon nanotube at a crossing position.

18 Claims, 2 Drawing Sheets

METHOD FOR FORMING RECESS DEFECT ON CARBON NANOTUBE

BACKGROUND

1. Technical Field

The present disclosure relates to a method for forming a recess defect on carbon nanotubes.

2. Description of Related Art

Carbon nanotube is an ideal catalyst carrier because of the large surface area and high chemical stability. The composite, which has carbon nanotubes composited with the catalyst, has shown great promise of use in fields of electrochemical cell, fuel cell, and biomedicine.

When using the composite as a catalyst, the uniformity and amount of the catalyst particles loaded and dispersed on the surface of the carbon nanotubes directly influence catalytic performance of the composite. The catalytic performance of the composite increases with the amount of catalyst particles that are loaded, however, catalyst particles easily aggregate when the amount of the catalyst particles loaded increases.

The composite is commonly fabricated by physical methods or chemical methods. Catalyst particles are sputtered on the surface of the carbon nanotubes by physical methods. Chemical methods include colloid method, solution reduction method, immersion method, electrochemical deposition method, or supercritical fluid method. However, it is difficult to have a balance between the loading amount and the dispersing uniformity of the catalyst particles on the surface of the carbon nanotubes with the methods mentioned above.

What is needed, therefore, is to provide a method for making a carbon nanotube based composite having a relatively high loading amount of catalyst particles well dispersed.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
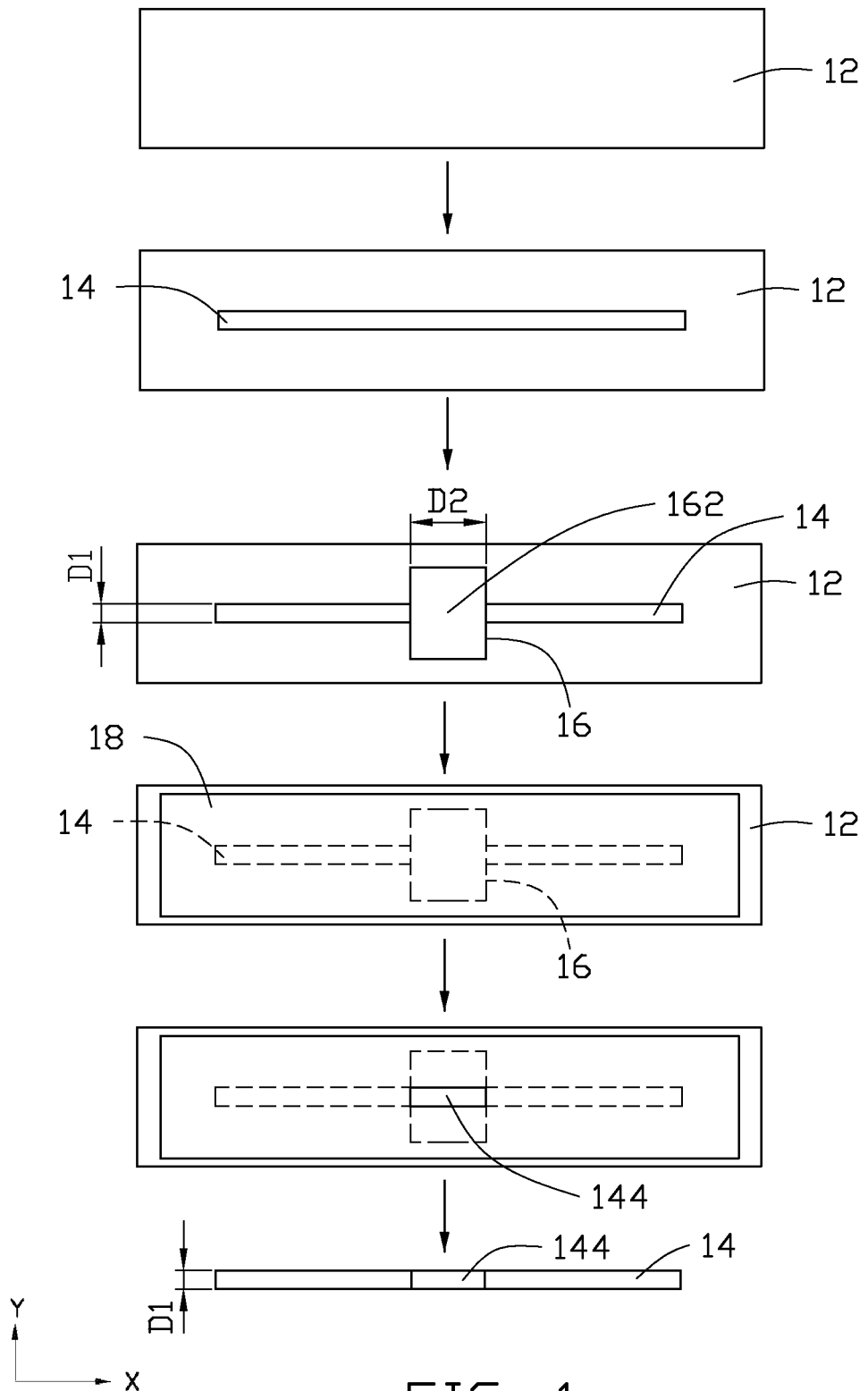
FIG. 1 is a top plan view of one embodiment of making a recess defect on a surface of carbon nanotubes.
Figure 2:
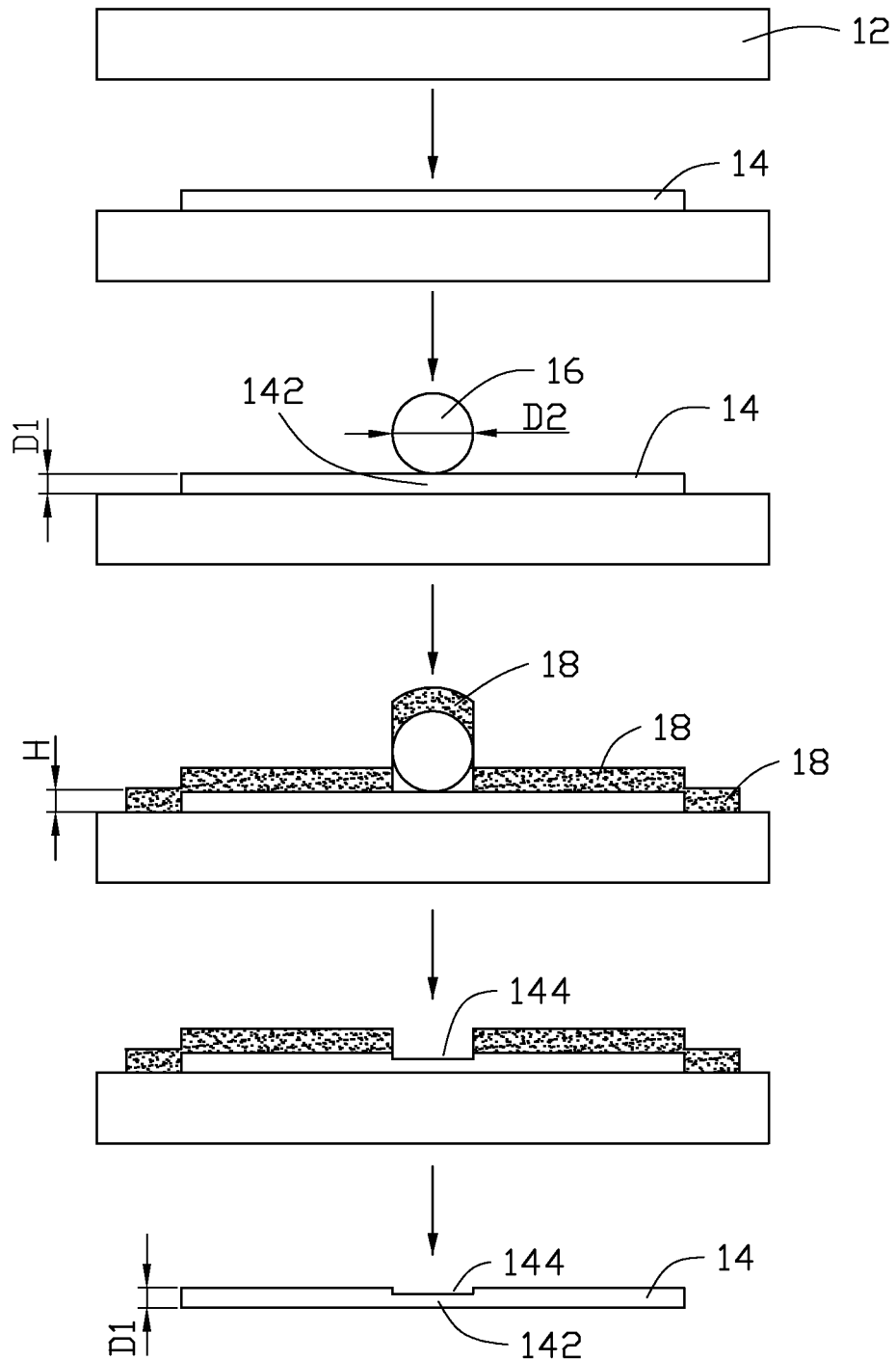
FIG. 2 is a side view of one embodiment of making a recess defect on a surface of carbon nanotubes.

Referring to FIG. 1 and FIG. 2, a method forming a recess defect on carbon nanotubes includes the steps of:

S10: providing a substrate 12 with a surface;

S20: depositing a first carbon nanotube 14 on the surface of the substrate 12 along a first axis, such as an X axis shown in FIG. 1;

S30: putting a second carbon nanotube 16 across the first carbon nanotube 12 along a second axis, such as a Y axis shown in FIG. 1;

S40: depositing a mask 18 on the surface of the substrate 12;

S50: etching the substrate 12 to remove the second carbon nanotube 16 and form a recess defect 144 on the first carbon nanotube 14; and S60: removing the mask 18 and the substrate 12 to obtain the first carbon nanotube 14 with the recess defect 144.

In the step S10, the substrate 12 could be an insulated substrate or an uninsulated substrate. The first carbon nanotube 14 and the second carbon nanotube 16 are deposed on the substrate 12. In one embodiment, the substrate 12 is a silicon substrate.

In the step S20 and the step S30, the first carbon nanotube 14 could be a single-walled carbon nanotube, a double-walled carbon nanotube, a multi-walled carbon nanotube, or any combination thereof. Similarly, the second carbon nanotube 16 could be a single-walled carbon nanotube, a double-walled carbon nanotube, a multi-walled carbon nanotube, or any combination thereof. The second carbon nanotube 16 crosses the first carbon nanotube 14 and is in contact with the first carbon nanotube 14 at a crossing position. Thus, a position of the first carbon nanotube 14 covered by the second carbon nanotube 16 is defined as a defect region 142. A position of the second carbon nanotube 16 crossing the first carbon nanotube 14 is defined as a cover region 162. The cover region 162 and the defect region 142 are crossed.

Furthermore, the first carbon nanotube 14 could be a straight carbon nanotube, a curvilinear carbon nanotube, or a carbon nanotube with other forms. Similarly, the second carbon nanotube 16 could be a straight carbon nanotube, a curvilinear carbon nanotube, or a carbon nanotube with other forms.

If the first carbon nanotube 14 and the second carbon nanotube 16 are curvilinear carbon nanotubes, the second carbon nanotube 16 curves around the first carbon nanotube 14 and forms a number of contacts. In other words, there are a number of defect regions 142 at the first carbon nanotube 14. There are a number of cover regions 162 at the second carbon nanotube 16 across the defect regions 142 of the first carbon nanotube 14.

If the first carbon nanotube 14 and the second carbon nanotube 16 are straight carbon nanotubes, the second carbon nanotube 16 is in contact with the first carbon nanotube 14 to form a contact. In other words, there is a defect region 142 at the first carbon nanotube 14. There is a cover region 162 at the second carbon nanotube 16 across the defect region 142 of the first carbon nanotube 14.

Because the second carbon nanotube 16 crosses the first carbon nanotube 14, an included angle between the X axis and the Y axis is in a range from about 0 degrees to about 90 degrees. In the embodiment, the X axis is substantially perpendicular to the Y axis.

As shown in the FIG. 1 and FIG. 2, the first carbon nanotube 14 has a diameter D1. The second carbon nanotube 16 has a diameter D2. The diameter D2 of the second carbon nanotube 16 is greater than two times the diameter D1 of the first carbon nanotube 14. In other words, the second carbon nanotube 16 has a radius greater than the diameter D1 of the first carbon nanotube 14. The diameter D1 of the first carbon nanotube 14 is in a range from about 0.4 nanometers to about 25 nanometers. The diameter D2 of the second carbon nanotube 16 is in a range from about 0.8 nanometers to about 50 nanometers. If the diameter D2 of the second carbon nanotube 16 is greater, an area of the defect region 142 of the first carbon nanotube 14 is greater. In addition, if the diameter D2 of the second carbon nanotube 16 is about 10 nanometers, a size of the defect region 142 of the first carbon nanotube 14 along the X axis is about 10 nanometers. A size of the defect region 142 of the first carbon nanotube 14 along the Y axis is less than 10 nanometers. In one embodiment, the first carbon nanotube 14 and the second carbon nanotube 16 are straight carbon nanotubes substantially perpendicular to each other. The diameter D1 of the first carbon nanotube 14 is about 2.5 nanometers. The diameter D2 of the second carbon nanotube 16 is about 10 nanometers.

In the step S40, the mask 18 is deposited on the substrate 12, the first carbon nanotube 14, and the second carbon nanotube 16 along a direction substantially perpendicular to the surface of the substrate 12. As shown in FIG. 2, a thickness H of the mask 18 is greater than the diameter D1 of the first carbon nanotube 14, and is less than the radius of the second carbon nanotube 16. Because the thickness H of the mask 18 is greater than the diameter D1 of the first carbon nanotube 14, the first carbon nanotube 14 is covered by the mask 18 except the defect region 142 in contact with the second carbon nanotube 16. Furthermore, because the thickness H of the mask 18 is less than the radius of the second carbon nanotube 16, the second carbon nanotube 16 is partly exposed to the mask 18.

The mask 18 is manufactured by insulating material. In one embodiment, the mask 18 is manufactured by insulating material without carbon. The insulating material could be silica, hafnium oxide, alumina, or any oxide. In one embodiment, the mask 18 is manufactured by silica and is deposited on the substrate 12, the first carbon nanotube 14, and the second carbon nanotube 16 by methods such as electron beam evaporation and magnetron sputtering. The thickness H of the mask 18 is about 3 nanometers.

In the step S50, the substrate 12 can be etched by reactive ion etching. More specifically, the substrate 12 is placed in a microwave plasma system (not shown). The microwave plasma system generates oxygen plasma, chlorine plasma, or argon plasma. When the plasma diffuses to the substrate 12, the plasma etches the second carbon nanotube 16 to remove the second carbon nanotube 16 such that the cover region 162 of the second carbon nanotube 16 is removed to expose the defect region 142 of the first carbon nanotube 14. The plasma also etches the defect region 142 of the first carbon nanotube 14 to form the recess defect 144 at the defect region 142 of the first carbon nanotube 14.

In the step S60, the mask 18 is removed by immersing the substrate 12 in a chemical solution (not shown). In one embodiment, the chemical solution reacts to the mask 18 but not the first carbon nanotube 14. Thus, the first carbon nanotube 14 remains on the surface of the substrate 12. The first carbon nanotube 14 could be removed from the substrate 12 by a stripping method.

In another embodiment, a number of first carbon nanotubes 14 could be deposed on the surface of the substrate 12 along the first axis in the step 20. The first carbon nanotubes 14 are substantially parallel to each other. A number of second carbon nanotubes 16 are crossed with the first carbon nanotubes 14 along the second axis in the step 30. The second carbon nanotubes 16 are substantially parallel to each other. Thus, a number of recess defects 144 are formed on each of the first carbon nanotubes 14.

After the second carbon nanotube crosses with the first carbon nanotube deposed on a substrate, the substrate is etched for a controlled period of time. Thus, a position, a size, and an amount of the recess defect can be precisely formed on the first carbon nanotube. The first carbon nanotube with the recess defect can have a relatively high loading amount of catalyst particles well dispersed.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

It is also to be understood that above description and the claims drawn to a method may include some indication in reference to certain steps. However, the indication used is only to be viewed for identification purposes and not as a suggestion as to an order for the steps.

What is claimed is:

1. A method for forming a recess defect on carbon nanotubes, comprising steps of:
    providing a substrate with a surface;
    deposing a first carbon nanotube on the surface of the substrate along a first axis;
    putting a second carbon nanotube across the first carbon nanotube along a second axis, wherein the second carbon nanotube is in contact with the first carbon nanotube at a crossing position;
    depositing a mask on the surface of the substrate; and
    etching the substrate to remove the second carbon nanotube and form at least one recess defect on the first carbon nanotube at the crossing position being in contact with the second carbon nanotube.

2. The method as claimed in claim 1, wherein the second carbon nanotube has a radius greater than a diameter of the first carbon nanotube.

3. The method as claimed in claim 2, wherein the mask has a thickness greater than the diameter of the first carbon nanotube and less than the radius of the second carbon nanotube.

4. The method as claimed in claim 1, wherein an included angle between the first axis and the second axis is in a range from about 0 degrees to about 90 degrees.

5. The method as claimed in claim 4, wherein the first axis is substantially perpendicular to the second axis.

6. The method as claimed in claim 1, wherein the substrate is an insulating substrate.

7. The method as claimed in claim 1, wherein a material of the mask is selected from the group consisting of silica, hafnium oxide, alumina, and any combination thereof.

8. The method as claimed in claim 1, wherein the mask is deposited on the surface of the substrate by electron beam evaporation or magnetron sputtering.

9. The method as claimed in claim 1, wherein the substrate is etched by reactive ion etching.

10. The method as claimed in claim 1, further comprising a step of:
    removing the mask and the substrate to obtain the first carbon nanotube with the at least one recess defect.

11. The method as claimed in claim 1, wherein the first carbon nanotube is covered by the mask, and the second carbon nanotube is partly exposed to the mask.

12. A method for forming a recess defect on a carbon nanotube, comprising steps of:
    providing a substrate;
    deposing a first carbon nanotube, having a diameter, on the substrate;
    putting a second carbon nanotube, having a radius, across the first carbon nanotube, wherein the second carbon nanotube is in contact with the first carbon nanotube to define a defect region in the first carbon nanotube and a cover region in the second carbon nanotube;
    depositing a mask, with a thickness, on the substrate, the first carbon nanotube, and the second carbon nanotube, wherein the thickness of the mask is greater than the diameter of the first carbon nanotube and less than the radius of the second carbon nanotube;

etching the second carbon nanotube to remove the cover region to expose the defect region of the first carbon nanotube; and etching the defect region of the first carbon nanotube to form a recess defect at the defect region of the first carbon nanotube.

13. The method as claimed in claim 12, wherein the first carbon nanotube is deposed on the substrate along a first axis, and the second carbon nanotube is crossed with the first carbon nanotube along a second axis.

14. The method as claimed in claim 13, wherein an included angle between the first axis and the second axis is in a range from about 0 degrees to about 90 degrees.

15. The method as claimed in claim 14, wherein the first axis is substantially perpendicular to the second axis.

16. The method as claimed in claim 12, wherein a material of the mask is selected from the group consisting of silica, hafnium oxide, alumina, and any combination thereof.

17. The method as claimed in claim 12, wherein the mask is deposited on the substrate, the first carbon nanotube, and the second carbon nanotube by electron beam evaporation or magnetron sputtering.

18. The method as claimed in claim 12, wherein the substrate is etched by reactive ion etching.

* * * * *